(12) United States Patent
Lee et al.

(10) Patent No.: US 7,888,956 B2
(45) Date of Patent: Feb. 15, 2011

(54) APPARATUS FOR TESTING A SEMICONDUCTOR DEVICE AND A METHOD OF FABRICATING AND USING THE SAME

(75) Inventors: Hyun-Ae Lee, Suwon-si (KR); Dong-Dae Kim, Yongin-si (KR); Hoon-Jung Kim, Yongin-si (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 72 days.

(21) Appl. No.: 12/232,449

(22) Filed: Sep. 17, 2008

(65) Prior Publication Data

US 2009/0072847 A1    Mar. 19, 2009

(30) Foreign Application Priority Data

Sep. 18, 2007   (KR) .................... 10-2007-0094493

(51) Int. Cl.
*G01R 31/02* (2006.01)
(52) U.S. Cl. ................... 324/754; 324/758; 324/761
(58) Field of Classification Search ............. 324/72.5, 324/158.1, 750–755, 690, 638; 438/482, 438/674
See application file for complete search history.

(56) References Cited

U.S. PATENT DOCUMENTS

| | | | | |
|---|---|---|---|---|
| 4,923,407 A * | 5/1990 | Rice et al. | | 439/92 |
| 5,115,200 A * | 5/1992 | Lahitte et al. | | 324/718 |
| 6,680,617 B2 * | 1/2004 | Moreland et al. | | 324/638 |
| 6,828,768 B2 * | 12/2004 | McTigue | | 324/72.5 |
| 7,102,363 B2 * | 9/2006 | Talanov et al. | | 324/639 |
| 7,262,614 B1 * | 8/2007 | Campbell | | 324/754 |
| 7,321,234 B2 * | 1/2008 | Campbell et al. | | 324/754 |
| 7,436,191 B2 * | 10/2008 | Yang | | 324/754 |
| 7,492,143 B2 * | 2/2009 | Kwark | | 324/72.5 |
| 7,586,318 B2 * | 9/2009 | Yang | | 324/754 |
| 7,592,822 B2 * | 9/2009 | Reed et al. | | 324/754 |

FOREIGN PATENT DOCUMENTS

| | | |
|---|---|---|
| JP | 11-108955 | 4/1999 |
| JP | 2001-153885 | 6/2001 |
| JP | 2001-272416 | 10/2001 |
| KR | 1020010017689 | 3/2001 |

\* cited by examiner

*Primary Examiner*—Minh N Tang
*Assistant Examiner*—Trung Q Nguyen
(74) *Attorney, Agent, or Firm*—Harness, Dickey & Pierce, P.L.C.

(57) ABSTRACT

Example embodiments provide for an apparatus for testing various kinds of semiconductor devices having different distances between probes. Example embodiments also provide for a method of fabricating and using said apparatus. In accordance with example embodiments, an apparatus for testing a semiconductor device may include at least one cable penetrating a plate and extending from a surface of the plate. The at least one cable may include at least one signal line and at least one ground line. The apparatus may also include a pair of probes connected to the at least one signal line and configured to contact a first pad of a semiconductor device and a second pad of the semiconductor device. In accordance with example embodiments, the apparatus for testing a semiconductor device may also include a control unit on the surface of the plate configured to control a distance between the pair of probes.

19 Claims, 3 Drawing Sheets

APPARATUS FOR TESTING A SEMICONDUCTOR DEVICE AND A METHOD OF FABRICATING AND USING THE SAME

PRIORITY STATEMENT

This application claims priority under 35 U.S.C. §119 to Korean Patent Application No. 2007-94493, filed on Sep. 18, 2007 in the Korean Intellectual Property Office (KIPO), the entire contents of which are herein incorporated by reference.

BACKGROUND

1. Field

Example embodiments relate to an apparatus for testing a semiconductor device. More particularly, example embodiments relate to an apparatus for testing a device having a high frequency characteristic. Example embodiments also relate to a method of fabricating and using the apparatus.

2. Description of the Related Art

Generally, there are at least three processes used in manufacturing semiconductor devices. The first process is a fabrication process in which electric circuits (including electric elements) are formed on a semiconductor substrate, e.g., a silicon wafer. The second process is an electrical die sorting (EDS) process for inspecting electrical characteristics of chips formed by the fabrication process. The third process is a packaging process for sealing the chips with a resin, e.g., epoxy.

In the EDS process, an electrical signal may be applied to a semiconductor device formed on a silicon wafer, and an output signal from the semiconductor device may be inspected to determine whether or not the semiconductor is defective. The EDS process may use a test apparatus including probes contacting pads of the semiconductor device directly.

The test apparatus may inspect a high frequency response, e.g., a high frequency characteristic, of a high frequency device. The high frequency device may process a high frequency in a range of several MHz to GHz bands. Examples of the high frequency device may be a resonator, a surface acoustic wave (SAW), and a duplex.

In a conventional test apparatus, a probe may be fixed by an epoxy resin to a printed circuit board connected to a cable. An electrical signal generated from a tester may be applied to the semiconductor device through the cable, the printed circuit board and the probe. A response of the semiconductor device may be obtained from an output signal of the semiconductor device to determine whether or not the semiconductor device is defective.

Because the probe may be fixed to the printed circuit board, distances between the probes may be uniform. Accordingly, the test apparatus may inspect a semiconductor device including pads having the same distances therebetween as those of the probes thereof. Therefore, different test apparatuses may be manufactured for semiconductor devices having different pad distances.

A conventional test apparatus may include various connection members for connecting the cable, a circuit line of the printed circuit board, and the probe to one another, and the connection members may include different materials. Thus, a resistance, a capacitance and an inductance due to the different materials of various connection members may occur. Furthermore, because the probe has a relatively long length of about 35 mm to about 40 mm, electromagnetic interferences (EMI) therebetween may occur.

SUMMARY

Example embodiments provide an apparatus of testing a semiconductor device capable of inspecting various kinds of semiconductor devices having different distances between the probes. Example embodiments also provide for a method of fabricating and using said apparatus.

In accordance with example embodiments, an apparatus for testing a semiconductor device may include at least one cable penetrating a plate and extending from a surface of the plate. The at least one cable may include at least one signal line and at least one ground line. The apparatus may also include a pair of probes connected to the at least one signal line. The pair of probes may include a first probe configured to contact a first pad of a semiconductor device and a second probe configured to contact a second pad of the semiconductor device. In accordance with example embodiments, the apparatus for testing a semiconductor device may also include a control unit on the surface of the plate configured to control a distance between the pair of probes.

In accordance with example embodiments, a method of fabricating an apparatus for testing a semiconductor device may include forming at least one cable with at least one signal line and at least one ground line through a penetration of a plate. The at least one cable may extend from a surface of the plate. In accordance with example embodiments, a method fabricating an apparatus for testing a semiconductor device may also include providing a pair of probes. The pair of probes may include a first probe configured to contact a first pad of a semiconductor device and a second probe configured to contact a second pad of a semiconductor device. In accordance with example embodiments, a method fabricating an apparatus for testing a semiconductor device may also include connecting the pair of probes to the at least one signal line, and providing a control unit on the surface of the plate to control a distance between the pair of probes.

In accordance with example embodiments, a method of using the above apparatus for testing a semiconductor device may include providing a semiconductor device with a signal pad and a ground pad, adjusting the position of the pair of probes so that the first probe contacts the signal pad of the semiconductor device and the second probe contacts the ground pad, and transmitting a high frequency signal via the at least one signal line to the signal pad of the semiconductor device.

BRIEF DESCRIPTION OF THE DRAWINGS

Example embodiments will be more clearly understood from the following detailed description taken in conjunction with the accompanying drawings.

FIG. 1 is a perspective view illustrating an apparatus for testing a semiconductor device in accordance with example embodiments.

FIG. 2 is an enlarged perspective view illustrating a control unit in FIG. 1.

FIG. 3 is a cross-sectional view illustrating connections of a cable, a probe and a ground member in FIG. 2.

FIG. 4 is a perspective view illustrating a control unit in FIG. 1 in accordance with example embodiments.

FIG. 5 is a cross-sectional view illustrating connections of a cable, a probe and a ground member in FIG. 4.

DETAILED DESCRIPTION OF EXAMPLE EMBODIMENTS

Figure 1:
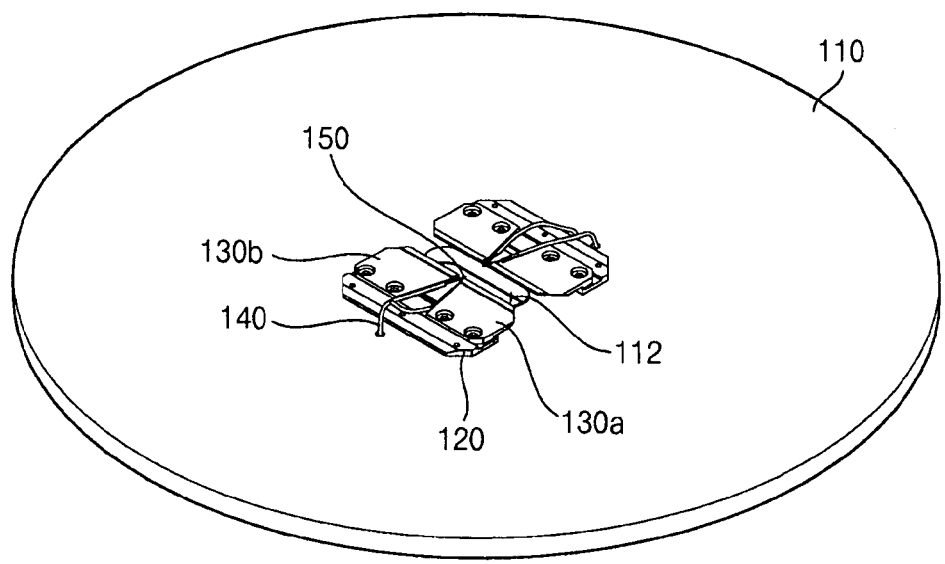
FIGS. 1 to 5 represent non-limiting, example embodiments as described herein.

Various example embodiments will be described more fully hereinafter with reference to the accompanying drawings, in which some example embodiments are shown. Example embodiments may, however, be embodied in many different forms and should not be construed as limited to the example embodiments set forth herein. Rather, these example embodiments are provided so that this disclosure will be thorough and complete, and will fully convey the scope of example embodiments to those skilled in the art. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers that may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of the present invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein. Hereinafter, example embodiments will be explained in detail with reference to the accompanying figures.

Figure 2:
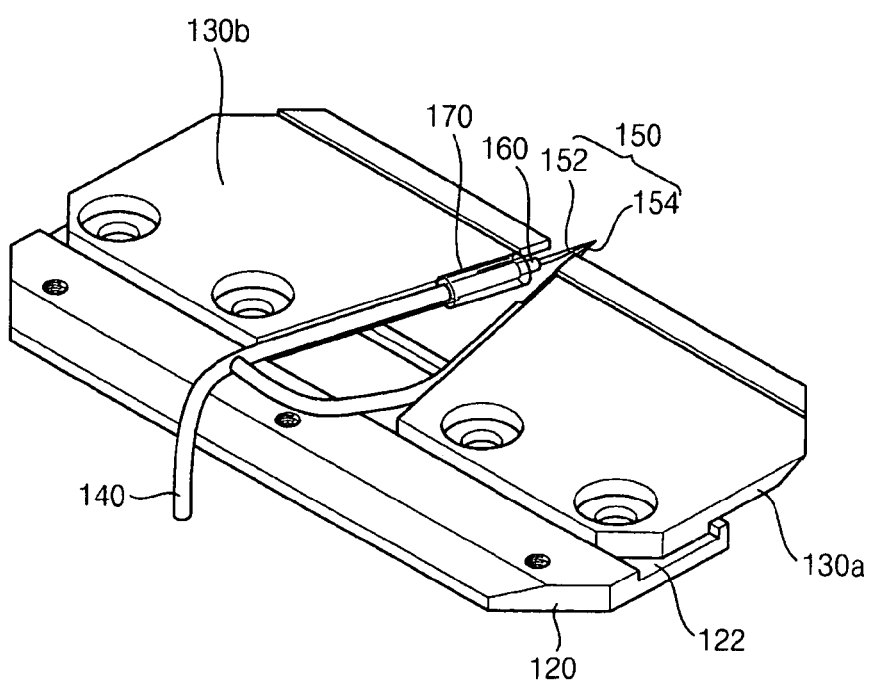

FIG. 1 is a perspective view illustrating an apparatus for testing a semiconductor device in accordance with example embodiments. FIG. 2 is an enlarged perspective view illustrating a control unit in FIG. 1. Referring to FIGS. 1 and 2, an apparatus for testing a semiconductor device 100 may include a plate 110, a slide base 120, a pair of slides 130a and 130b, a cable 140, a probe 150, a ground member 160, and a fixing member 170. The plate 110, in accordance with example embodiments, may be disk shaped. The plate 110 may have an opening 112 formed through the middle of the plate 110 and the opening 112 may penetrate the plate 110. The plate 110 may support the slide base 120.

The slide base 120 may have a plate shape of a size smaller than that of the plate 110. The slide base 120 may be provided on a surface of the plate 110 and may be provided adjacent to the opening 112. As shown in FIG. 2, one slide base 120 may be provided thereon, however, example embodiments are not limited thereto. For example, a plurality of the slide bases 120 may be provided thereon on the surface of the plate 110. The slide base 120 may be fixed to the plate 110 by a screw.

The slide base 120 may have a first surface making contact with the plate 110. The slide base may also include a second surface opposite to the first surface. In accordance with example embodiments, the slide base 120 may include a slide rail 122 on the second surface as shown in FIG. 2. The slide rail 122 may have a predetermined or given width.

A pair of the slides 130a and 130b may be provided in the slide rail 122 of the slide base 120. The slides 130a and 130b may move along the slide rail 122 and the distance between the pair of the slides 130a and 130b may be controlled. For example, one of the slides may be fixed and the other one of the slides may move along the slide rail 122. In particular, one of the slides may be fixed to the slide base 120 by a screw and the other one of the slides may move along the slide rail 122 to control the distance between the pair of the slides 130a and 130b. After the distance the between the pair of the slides 130a and 130b is determined, both of the slides 130a and 130b may be fixed to the slide base 120 by a fixing device, e.g., a screw.

Alternatively, the pair of the slides 130a and 130b may move simultaneously along the slide rail 122 to control the distance therebetween. After the distance between the slides 130a and 130b is adjusted, the pair of the slides 130a and 130b may be fixed to the slide base 120 by a fixing device, e.g., a screw.

Figure 3:
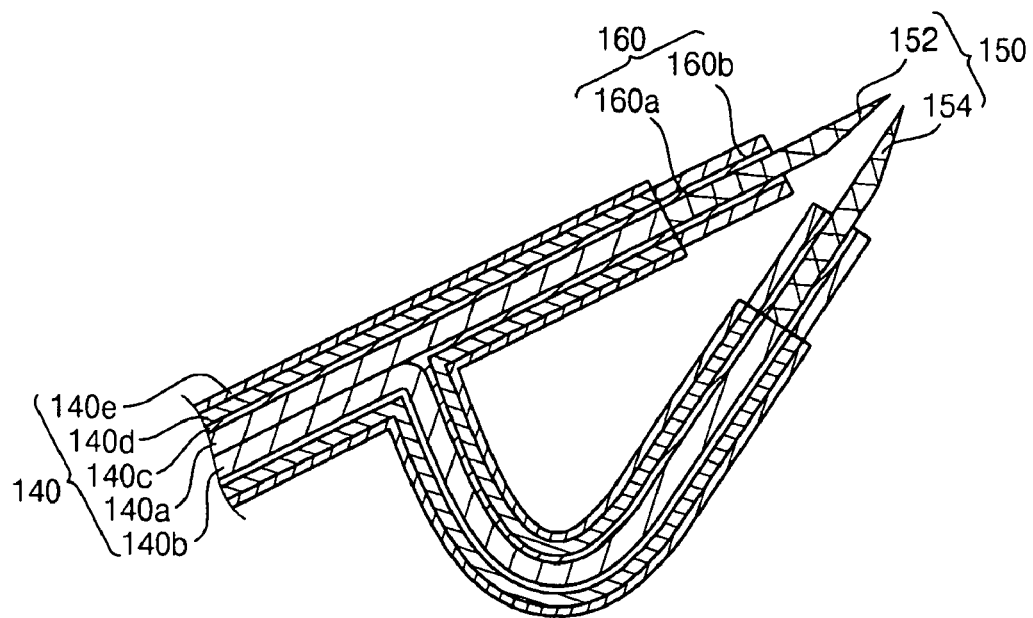

FIG. 3 is a cross-sectional view illustrating connections of a cable, a probe and a ground member in FIG. 2. Referring to FIGS. 1 to 3, the cable 140 may penetrate the plate 110 and may extend from the surface of the plate 110. The cable 140 may diverge into two branches and end portions of the cable 140 may be fixed to the pair of slides 130a and 130b by the fixing member 170. For example, the fixing member 170 may be an adhesive such as epoxy resin.

The cable 140 may include a first signal line 140a, a second signal line 140b, a first insulation layer 140c, a ground line 140d and an insulation coating 140e. The first signal line 140a and the second signal line 140b may branch off from the cable 140 to transmit signals for inspecting a semiconductor device. The first signal line 140a may transmit a high frequency signal and the second signal line 140b may transmit a ground signal. The first insulation layer 140c may cover the first signal line 140a and the second signal line 140b. The ground line 140d may be provided around the first insulation layer 140c. The insulation coating 140e may cover the first insulation layer 140c and may also cover the ground line 140d.

The probe 150 may make contact with pads of the semiconductor device directly. The probe 150 may include a first probe 152 and a second probe 154. The first probe 152 and the second probe 154 may be electrically connected to the first signal line 140a and the second signal line 140b, respectively. For example, the first probe 152 and the second probe 154 may be connected to the first signal line 140a and the second signal line 140b by soldering. When any one of the first and second probes 152 and 154 is defective, the defective probe may be replaced with a new probe. Because the first and second probes 152 and 154 may be respectively connected to the first and second signal lines 140a and 140b by soldering, a process for replacing the defective probe may be easily performed.

The first probe 152 may make contact with a signal pad of the semiconductor device to transmit the high frequency signal. The second probe 154 may make contact with a ground pad of the semiconductor device to transmit the ground signal.

Because the distance between the pair of the slides 130a and 130b to which the cable 140 is fixed may be controlled, a distance between the first probe 152 and the second probe 154 may be controlled. Although a distance between the signal pad and the ground pad may vary according to the kind of the semiconductor device, the distance between the first probe 152 and the second probe 154 may be controlled to correspond with the distance between the signal pad and the ground pad of the various kinds of semiconductor devices.

Because only one connection member where the cable 140 and the probe 150 are connected to each other may include a different material therefrom, a resistance, a capacitance and an inductance due to different materials of various conventional connection members may be reduced or minimized.

Because the cable 140 may extend to have a sufficient length, a length of the probe 150 may be reduced or minimized. For example, the probe 150 may have a length of about 2 μm to about 5 μm. Therefore, the high frequency signal and the ground signal may be stably transmitted, and electromagnetic interferences due to an externally exposed probe 150 may be prevented or reduced.

The ground member 160 may be provided to cover an outer surface of the probe 150 except for an end portion thereof contacting the pads. The ground member 160 may include a second insulation layer 160a and a conductive layer 160b. The second insulation layer 160a may be provided to cover the probe 150. The probe 150 may be insulated from the conductive layer 160b by the second insulation layer 160a. The conductive layer 160b may be provided to cover the second insulation layer 160a. The conductive layer 160b may be connected to the ground line 140d.

The ground member 160 may cover the probe 150 to minimize the externally exposed portion of the probe 150, such that the electromagnetic interferences may be reduced or prevented. Accordingly, the high frequency signal and the ground signal may be transmitted more stably through the probe 150. Alternatively, the ground member 160 may be omitted in the apparatus 100 for inspecting a semiconductor device.

Figure 4:
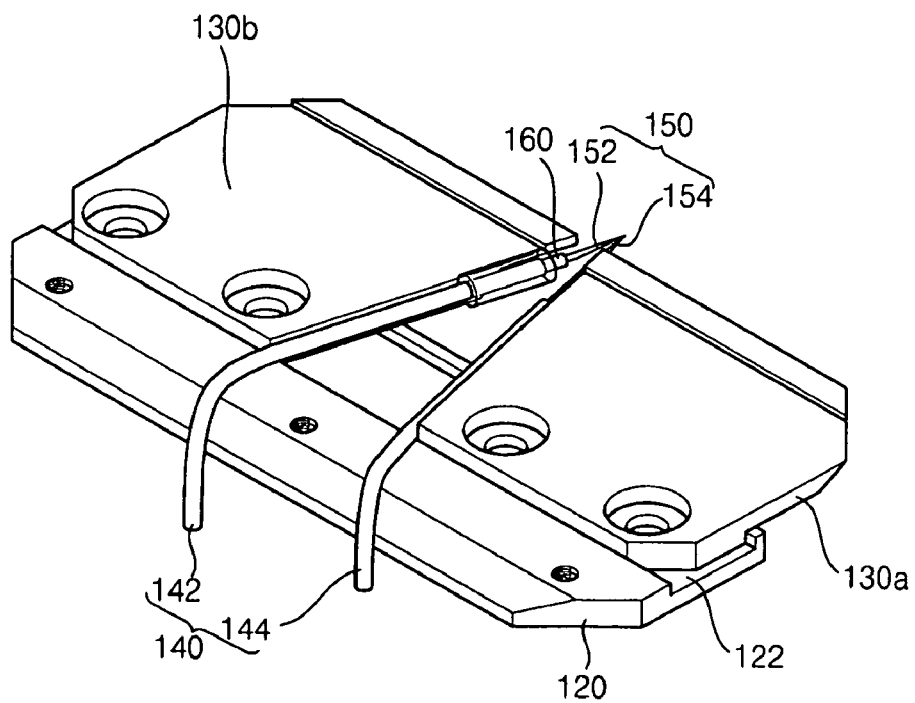
Figure 5:
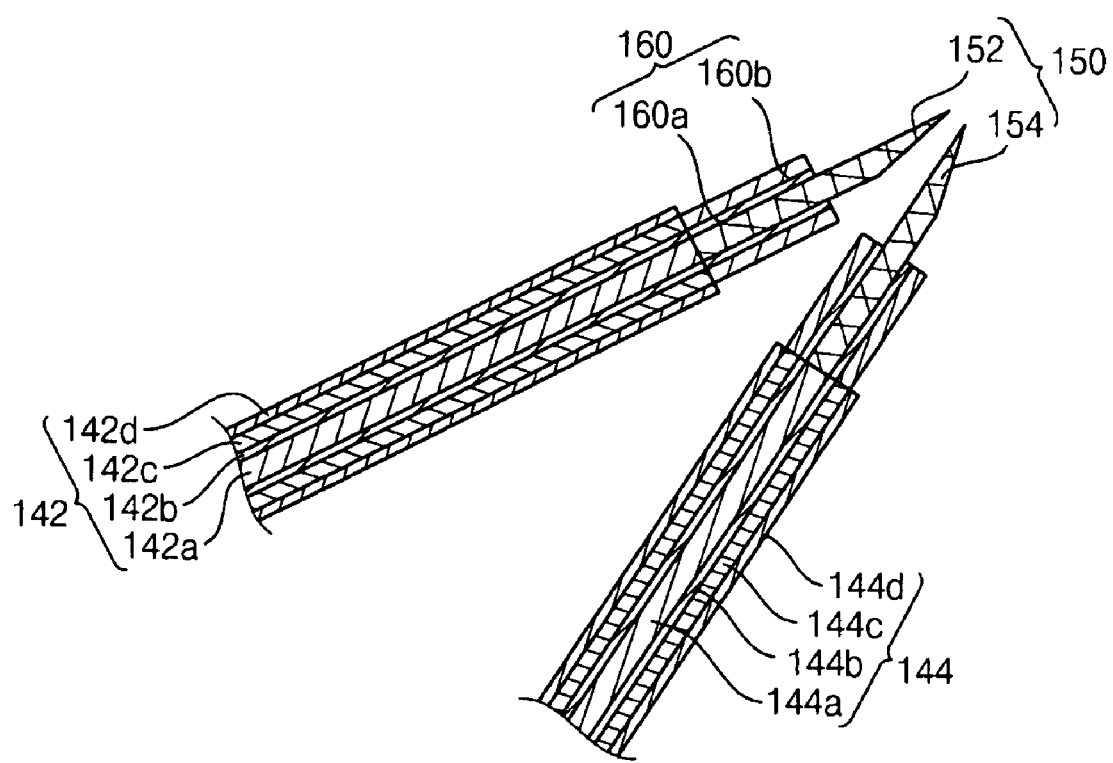

FIG. 4 is a perspective view illustrating a control unit in FIG. 1 in accordance with example embodiments. FIG. 5 is a cross-sectional view illustrating connections of a cable, a probe and a ground member in FIG. 4. Referring to FIGS. 4 and 5, the cable 140 may include a first cable 142 and a second cable 144. The first cable 142 may include a first signal line 142a, a first insulation layer 142b, a first ground line 142c and a first insulation coating 142d. The second cable 144 may include a second signal line 144a, a second insulation layer 144b, a second ground line 144c and a second insulation coating 144d.

The probe 150 may include a first probe 152 and a second probe 154. The first probe 152 may be connected to the first signal line 142 of the first cable 142. The second probe 154 may be connected to the second signal line 144a of the second cable 144. The example embodiments illustrated in FIGS. 4 and 5 may be substantially the same as example embodiments illustrated in FIGS. 1 to 3, except for the aforementioned description of the cable 140 and the probe 150.

As mentioned above, the apparatus for testing a semiconductor device in accordance with example embodiments may control the distance between the probes by moving the slides. Accordingly, the apparatus for testing a semiconductor device may inspect various kinds of the semiconductor devices.

Further, because the signal line of the cable of the apparatus may be connected to the probe, a resistance, a capacitance and an inductance may be reduced or minimized. Furthermore, the length of the probe may be minimized to reduce or prevent electromagnetic interferences. Furthermore, because the ground member that may be connected to the ground line of the cable may be provided on the outer surface of the probe, the occurrence of electromagnetic interferences may be reduced, minimized or prevented.

The foregoing is illustrative of example embodiments and is not to be construed as limiting thereof. Although example embodiments have been described, those skilled in the art will readily appreciate that many modifications are possible without materially departing from the novel teachings and advantages of example embodiments. Accordingly, all such modifications are intended to be included within the scope of example embodiments as defined in the claims. In the claims, means-plus-function clauses are intended to cover the structures described herein as performing the recited function and not only structural equivalents but also equivalent structures. Therefore, it is to be understood that the foregoing is illustrative and is not to be construed as limited to example embodiments disclosed, and that modifications to example embodiments are intended to be included within the scope of the appended claims.

What is claimed is:

1. An apparatus for testing a semiconductor device, the apparatus comprising:
at least one cable penetrating a substrate and extending from a surface of the substrate, the at least one cable including at least one signal line and at least one ground line;
a pair of probes connected to the at least one signal line, the pair of probes including a first probe configured to contact a first pad of a semiconductor device and a second probe configured to contact a second pad of the semiconductor device; and
a control unit on the surface of the substrate configured to control a distance between the pair of probes, wherein the control unit includes
a slide base on a surface of the substrate, the slide base including a slide rail, and
at least a first slide and a second slide configured to move along the slide rail and configured to control the distance between the pair of probes, the first probe being fixed to the first slide and the second probe being fixed to the second slide.

2. The apparatus of claim 1, wherein the first slide and the second slide are configured to move simultaneously.

3. The apparatus of claim 1, wherein one of the first slide and the second slide is fixed and the other one of the first slide and the second slide is configured to move.

4. The apparatus of claim 1, wherein the first slide and second slide is fixable to the slide base by a screw.

5. The apparatus of claim 1, wherein the probes have a length of about 2 μm to about 5 μm.

6. The apparatus of claim 1, wherein the semiconductor device is a high frequency device and the signal line of the cable transmits a high frequency signal.

7. The apparatus of claim 1, wherein the first pad is a signal pad and the second pad is a ground pad.

8. An apparatus for testing a semiconductor device, the apparatus comprising:
at least one cable penetrating a substrate and extending from a surface of the substrate, the at least one cable including at least one signal line and at least one ground line;
a pair of probes connected to the at least one signal line, the pair of probes including a first probe configured to contact a first pad of a semiconductor device and a second probe configured to contact a second pad of the semiconductor device; and
a control unit on the surface of the substrate configured to control a distance between the pair of probes, wherein the at least one signal line includes a first signal line and a second signal line, the at least one ground line covers the signal lines, and the first probe is connected to the first signal line and the second probe is connected to the second signal line.

9. The apparatus of claim 8, further comprising:
a first ground member on an outer surface of the first probe to insulate the first probe; and
a second ground member on an outer surface of the second probe to insulate the second probe, wherein the at least one ground line of the at least one cable is connected to the first ground member and the second ground member.

10. The apparatus of claim 9, wherein the first and second ground members are configured to cover the outer surfaces of the probes except the end portions.

11. The apparatus of claim 8, wherein the probes have a length of about 2 μm to about 5 μm.

12. The apparatus of claim 8, wherein the semiconductor device is a high frequency device and the signal line of the cable transmits a high frequency signal.

13. The apparatus of claim 8, wherein the first pad is a signal pad and the second pad is a ground pad.

14. An apparatus for testing a semiconductor device, the apparatus comprising:
at least one cable penetrating a substrate and extending from a surface of the substrate, the at least one cable including at least one signal line and at least one ground line;
a pair of probes connected to the at least one signal line, the pair of probes including a first probe configured to contact a first pad of a semiconductor device and a second probe configured to contact a second pad of the semiconductor device; and
a control unit on the surface of the substrate configured to control a distance between the pair of probes, wherein the at least one cable includes a first cable and a second cable, the at least one signal line includes a first signal line in the first cable and a second signal line in the second cable, and the at least one ground line includes a first ground line in the first cable and a second ground line in the second cable, and the first probe is attached to the first signal line and the second probe is attached to the second signal line.

15. The apparatus of claim 14, further comprising:
a first ground member on the outer surface of the first probe to insulate the first probe; and
a second ground member on the outer surface of the second probe to insulate the second probe, wherein the first ground line is connected to the first ground member and the second ground line is connected to the second ground member.

16. The apparatus of claim 15, wherein the first and second ground members are configured to cover the outer surfaces of the probes except the end portions thereof contacting the pads.

17. The apparatus of claim 14, wherein the probes have a length of about 2 μm to about 5 μm.

18. The apparatus of claim 14, wherein the semiconductor device is a high frequency device and the signal line of the cable transmits a high frequency signal.

19. The apparatus of claim 14, wherein the first pad is a signal pad and the second pad is a ground pad.

* * * * *